(12) United States Patent
Stelzl et al.

(10) Patent No.: US 6,722,030 B1
(45) Date of Patent: Apr. 20, 2004

(54) PROCESS FOR MANUFACTURING AN ELECTRONIC COMPONENT, IN PARTICULAR A SURFACE-WAVE COMPONENT WORKING WITH ACOUSTIC SURFACE WAVES

(75) Inventors: Alois Stelzl, Munich (DE); Hans Krueger, Munich (DE); Peter Demmer, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 09/622,351

(22) PCT Filed: Feb. 5, 1999

(86) PCT No.: PCT/DE99/00307

§ 371 (c)(1),
(2), (4) Date: Nov. 13, 2000

(87) PCT Pub. No.: WO99/43084

PCT Pub. Date: Aug. 26, 1999

(30) Foreign Application Priority Data

Feb. 18, 1998 (DE) .......................................... 198 06 818

(51) Int. Cl.⁷ ................................................. H05K 3/30
(52) U.S. Cl. ............................. 29/841; 29/412; 29/837; 29/839; 29/832; 29/855; 264/157; 264/272.11; 264/236; 264/347; 174/52.2; 174/52.3; 257/787
(58) Field of Search .................. 29/412–415, 837–839, 29/842, 832, 835, 841, 855; 83/929.1, 929.2; 264/272.17, 272.11, 157, 236, 347; 174/52.2, 52.3, 52.4; 257/666, 616, 787

(56) References Cited

U.S. PATENT DOCUMENTS

| | | | |
|---|---|---|---|
| 4,426,773 A | * | 1/1984 | Hargis .......................... 29/832 |
| 5,410,789 A | | 5/1995 | Noto et al. |
| 5,540,870 A | | 7/1996 | Quigley |
| 5,729,437 A | * | 3/1998 | Hashimoto .................. 174/260 |

FOREIGN PATENT DOCUMENTS

| | | |
|---|---|---|
| DE | 31 38 743 | 4/1983 |
| DE | 195 48 046 | 6/1997 |
| DE | 195 48 050 | 6/1997 |
| DE | 195 48 051 | 6/1997 |
| DE | 195 48 062 | 6/1997 |
| EP | 0 637 871 | 2/1995 |
| EP | 0 643 482 | 3/1995 |
| EP | 0 794 616 | 9/1997 |
| EP | 0 840 369 | 5/1998 |
| JP | 09 008596 | 1/1997 |
| WO | WO 97/02596 | 1/1997 |
| WO | WO 97/45955 | 12/1997 |

* cited by examiner

*Primary Examiner*—Richard Chang
(74) *Attorney, Agent, or Firm*—Schiff Hardin & Waite

(57) ABSTRACT

A method is provided for manufacturing a saw filter in which a carrier plate 10 that can be separated into base plates 2 is respectively provided with interconnects in the base plate regions A and these are contacted to the active structures of SAW chips 1 in flip-chip technique. A metal foil 3 or plastic film 4 is placed onto the chip-equipped carrier plate 10 and, for example, is pressure and heat treated such that it envelopes each chip 1 (except for the chip surface facing toward the carrier plate 10) and lies hermetically tight on the carrier plate surface in regions between the chips.

14 Claims, 2 Drawing Sheets

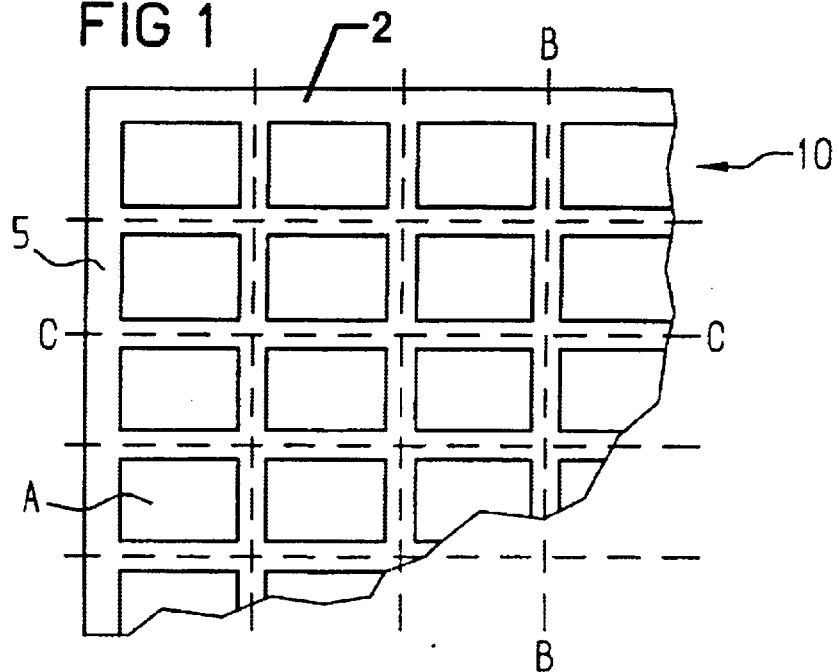
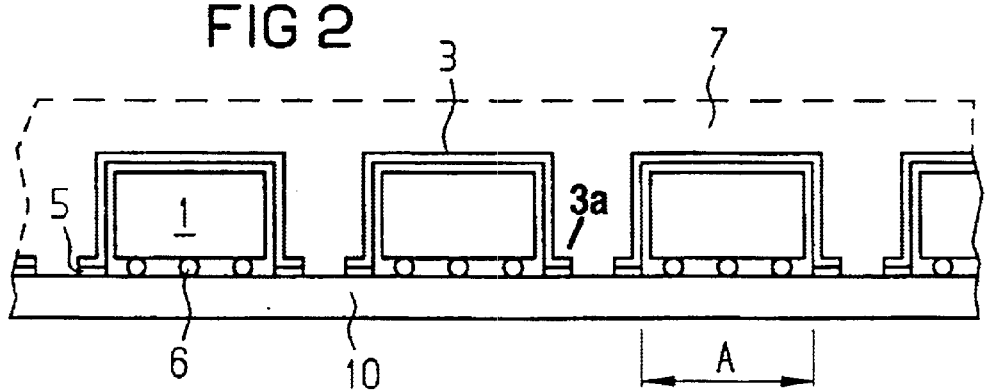
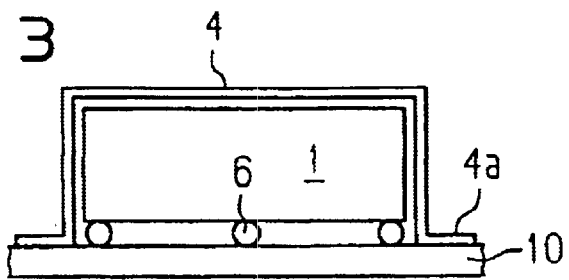

PROCESS FOR MANUFACTURING AN ELECTRONIC COMPONENT, IN PARTICULAR A SURFACE-WAVE COMPONENT WORKING WITH ACOUSTIC SURFACE WAVES

BACKGROUND OF THE INVENTION

1. Field of the Invention

The invention is directed to a method for manufacturing an electronic component, particularly a SAW component working with surface acoustic waves, comprising a chip with piezoelectric substrate and an active filter structures that are contacted to interconnects of a base plate, and comprising a cap-shaped housing that envelopes the chip and is tightly seated on the base plate.

2. Description of the Related Art

For protection against disturbing environmental influences, particularly against chemically. Aggressive substances and moisture, a potentially multi-layer and after layer insert usually 2-layer, structured protective films, (Protec) by the assignee, is arranged between a base plate and a chip given active filter structures contacted to the ceramic or plastic base plate in flip-chip technique,—i.e. with bumps or, respectively, solder balls. Protected by this film, the SAW filter can have a casting compound, for example—epoxy resin, filled under it and cast around it after the flip-chip bonding without the active filter structure being thereby coated and the surface waves being undesirably attenuated.

For SAW filters of the ultra-frequency pass range that are contacted in flip-chip technique, i.e. typically given chip dimensions less than approximately 2×2 mm$^2$, it has been shown that an adequate stability given alternating temperature stressing is established even when the corresponding spaces between base plate and

SUMMARY OF THE INVENTION

As a result of observation, the object of the invention is to specify a method that enables the eliminate of the expensive PROTEC encapsulation of the SAW components and that nonetheless produces excellent SAW components.

For achieving this object in a method of the species initially cited, the invention provides that a carrier plate that can be separated into base plates is respectively provided with interconnects in the base plate regions, that one chip per base plate region is contacted to the interconnects thereof in flip-chip technique, that a cover film, particularly a metal foil or a potentially metal-coated plastic film, is applied onto the chip-equipped carrier plate, that the cover film is treated, (e.g.—heat and pressure treated,) such that it envelopes each chip—except for the chip surface facing toward the carrier plate—and lies tightly on the carrier plate surface in regions between the chips, and that the carrier plate is separated into the individual SAW components.

BRIEF DESCRIPTION OF THE DRAWINGS

Developments of the invention can be derived from the discussion below and the drawing together with the description thereof.

FIG. 1 is a plan view onto an inventively employed carrier plate in a partially broken illustration;

FIG. 2 is a partially cut and broken side view of a first exemplary embodiment of a chip-equipped carrier plate according to the method of the invention; and FIG. 3 is a second exemplary embodiment of an SAW filter fabricated according to the method of the invention, likewise in a partially cut side view.

In FIG. 1, in the first-cited method, a carrier plate 10, for example, a ceramic or plastic plate, that can be separated into base plates 2 along the parting lines B—B and C—C is provided with interconnects (not shown in the drawing) in the respective base plate regions A, these interconnects being usually through connected to the backside base plate region. The carrier plate 10 is coated with a solderable metal grid 5 corresponding to the base plate dimensions—preferably simultaneously with the application of the interconnects—, and one chip 1 per base plate region is subsequently contacted by bumps 6 to the interconnects of it in flip-chip technique.

Figure 4:
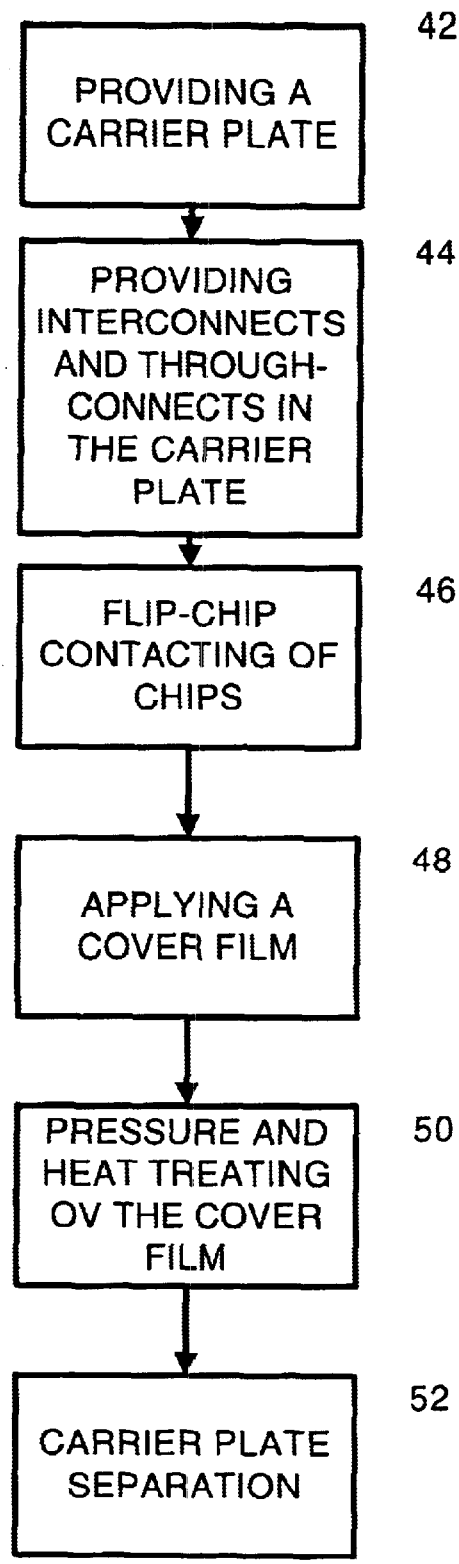
FIG. 4 is a flowchart illustrating the inventive method.

Finally, a cover film—namely a metal foil 3 having suitable thickness and ductility—is applied onto the chip-equipped carrier plate 10 and is pressure and heat treated for example, in an autoclave or under a vacuum, such that it tightly envelopes each chip 1 (except for the chip surface neighboring the carrier plate 10), and it lies on the metal grid in the regions between the chips 1 and is soldered to it along the solderable metal frame.

As a result of this type of processing, the metal foil 3, may also be implemented using an ultrasound application along the metal grid 5 as well, the metal foil 3 conforming to each chip 1 as a quasi as cap-shaped housing that has its face edges seated hermetically tight on the metal frame 5 or, respectively, on the carrier plate 10.

Assuming no hermetically tight closure is required between the foil and the base plate, then a plastic film 4 (see FIG. 3) that is potentially metal-coated for electromagnetic shielding can be employed instead of the metal foil 3. The plastic film may be composed, for example, of an adhesive material in the B-condition or may be adhesive-coated on its surface facing toward the carrier plate 10. This film, which can also be subjected to a pressure and heat treatment in an autoclave, also surrounds the chip hermetically tight. However, since a metal grid 5 is superfluous given plastic films, the face edge 4a of each "plastic housing" is seated directly on the carrier plate 10 or, respectively, on the base plate 2.

One may also to deep-draw the metal or plastic foil or film 3 4 cap-shaped in a grid dimension defined by the base plates 2 and to invert this partly deep-drawn foil over the chip-equipped carrier plate 10, after which it has its regions 3a, 4a lying on the carrier plate 10 tightly joined to the carrier plate in the previously described way. This possibility is of great significance, particularly for shrink-free or low-shrink carrier plates.

The housings that have arisen in this way in a copy technique can be further-stabilized and additionally sealed hermetically tight to a metal cladding by pressing or casting, for example, with epoxy resin, as indicated with broken lines in FIG. 2 (see region 7).

Furthermore, partial layer sequences composed can be applied onto the outside and/or inside surface of the metal foil and plastic film 3 4, these partial layer sequences being adapted such that they attenuate disturbing acoustic volume waves, potentially in collaboration with a pressing or casting compound 7.

Filled epoxy resins are especially suited as damping compound, for example with SiO$_2$, W, WO$_3$ or Ag as a filling constituent. The above-described method is illustrative of the principles of the present invention. Numerous modifications and adaptions thereof will be readily apparent to those skilled in this art without departing from the spirit and scope of the present invention.

What is claimed is:

1. A method for manufacturing an electronic component, comprising the steps of:

providing a carrier plate showing base plate regions, said carrier plate being separable into base plates, each base plate being associated with one of said base plate regions;

providing interconnections in every base plate region of the carrier plate;

contacting one chip per base plate region to said interconnects in a flip-chip technique;

applying a plastic film composed of an adhesive material in a B-condition as a cover film onto said chip-equipped carrier plate;

pressure and heat treating said cover film such that it envelopes each said chip except for a chip surface facing toward said carrier plate and lies on said carrier plate surface in regions between said chips; and separating said carrier plate into individual said electronic components.

2. A method according to claim 1, further comprising the step of metal-coating said cover film.

3. A method according to claim 1, further comprising the step of adhesive coating said cover film on its surface facing toward said carrier plate.

4. A method according to claim 1, further comprising the steps of:

deep-drawing said cover film cap-shaped in advance in a grid dimensions defined by base plates, inverting said cover film over said chip-equipped carrier plate; and joining regions of said cover film lying on the carrier plate to said carrier plate.

5. The method according to claim 1, wherein said cover film is applied onto said chips and said carrier plate by pressure and heat treatment.

6. A method according to claim 5, wherein said pressure and heat treatment ensues under vacuum.

7. The method according to claim 1, wherein said carrier plate is made of a material selected from the group consisting of ceramic and plastic.

8. The method according to claim 7, wherein said carrier plate is through-contacted and is coated with interconnects on both sides.

9. A method according to claim 1, further comprising the step of pressing out after enveloping said chips said cover film with plastic.

10. A method according to claim 1, further comprising the step of:

applying partial layer sequences comprising a damping compound are applied onto a surface selected from the group consisting of an outside and an inside surface of said metal foil and plastic film said partial layer sequences being adapted such that they attenuate disturbing acoustic volume waves.

11. A method according to claim 10, wherein filled epoxy resin is employed as said damping compound.

12. A method according to claim 11, wherein said epoxy resin is filled with a compound selected from the group consisting of $SiO_2$, W, $WO_3$ and Ag.

13. A method according to claim 1, further comprising the step of casting out, after enveloping said chips, said cover film with plastic.

14. A method according to claim 10, wherein said partial layer sequences attenuate disturbing acoustic volume waves in collaboration with a pressing or casting compound.

* * * * *